US006659705B1

(12) United States Patent
Reinnagel et al.

(10) Patent No.: US 6,659,705 B1
(45) Date of Patent: Dec. 9, 2003

(54) COVER TAPE CUTTING SYSTEM USING A THERMAL ENERGY SOURCE

(75) Inventors: Alan R. Reinnagel, Pittsford, NY (US); John Piccone, Webster, NY (US)

(73) Assignee: Delaware Capital Formation, Inc., Wilmington, DE (US)

( * ) Notice: Subject to any disclaimer, the term of this patent is extended or adjusted under 35 U.S.C. 154(b) by 0 days.

(21) Appl. No.: 10/042,816

(22) Filed: Jan. 9, 2002

Related U.S. Application Data

(60) Provisional application No. 60/260,837, filed on Jan. 10, 2001.

(51) Int. Cl.[7] ............................................. B65B 69/00
(52) U.S. Cl. ...................................... 414/412; 156/584
(58) Field of Search ................................ 414/412, 403; 221/74; 156/584

(56) References Cited

U.S. PATENT DOCUMENTS

| | | | |
|---|---|---|---|
| 4,820,369 A | | 4/1989 | Kubo |
| 4,944,979 A | * | 7/1990 | Gagliano et al. .............. 428/43 |
| 5,908,114 A | * | 6/1999 | Althouse et al. ............. 206/714 |
| 6,229,114 B1 | * | 5/2001 | Andrews et al. ....... 219/121.72 |
| 6,269,860 B1 | * | 8/2001 | Ishikawa et al. ............. 156/584 |
| 6,388,231 B1 | * | 5/2002 | Andrews ............... 219/121.69 |
| 6,402,452 B1 | * | 6/2002 | Miller et al. ................. 414/412 |

FOREIGN PATENT DOCUMENTS

DE  3214600 A1  10/1983

* cited by examiner

*Primary Examiner*—Thomas J. Brahan
(74) *Attorney, Agent, or Firm*—Basch & Nickerson LLP; Duane C. Basch

(57) ABSTRACT

The present invention is a method and apparatus for cutting the cover tape on a component carrier tape in order to allow component retrieval by an automated assembly system. More specifically, the cover tape is cut using a radiant energy beam that vaporizes the cover tape layer so as to partially expose the component below. The cover tape flap(s) created by the cutting operation may then be folded back so as to expose the component for retrieval at the pick-up location. Subsequent to the pick-up location, the carrier tape with the parted cover tape flap(s) attached thereto, are directed to a waste receptacle or similar disposal mechanism.

15 Claims, 5 Drawing Sheets

COVER TAPE CUTTING SYSTEM USING A THERMAL ENERGY SOURCE

CROSS REFERENCE

The following related applications are hereby incorporated by reference for their teachings:

Co-pending U.S. patent application Ser. No. 09/558,114 for a "COMPONENT TAPE FEEDER WITH COVER TAPE PEELBACK" filed Apr. 25, 2000 by James G. Miller et al.; and A Provisional Application for a "RADIANT BEAM COVER TAPE CUTTING SYSTEM," by Alan R. Reinnagel et al., application Ser. No. 60/260,837, filed Jan. 10, 2001. (Atty. Dkt. ARR-1P).

This invention relates generally to component feeding systems, and moir particularly to a system for slitting a cover tape in a tape-based component feeding systems used in conjunction with surface-mount or equivalent automated assembly systems.

BACKGROUND AND SUMMARY OF THE INVENTION

The present invention is directed to an improvement of tape or component feeders used in surface mount assembly technology in which electronic components are placed at precise locations on the surface of a printed circuit board. As illustrated by the Hover-Davis MPF and QP2F products, component tape feeders are used for sequentially feeding surface-mount components to a host assembly system. The host system typically includes a pick-and-place machine having an automated or robotic head for retrieving the component from the component feeder and placing the component on the surface of a printed circuit board that is being assembled.

For ease of assembly and use, components are often stored in a carrier tape as depicted in Prior Art FIG. 1. Carrier tape 30, consists of a flexible base 32 of paper or plastic having depressions 34 at regular intervals along its length. Carried within each depression is one component 36 to be placed on the printed circuit board. The components 36 are secured within their respective depressions using a thin transparent material 40, commonly referred to as "cover tape" or "cover layer" that extends the length of the carrier tape, and is generally slightly wider than the depressions that it covers. The cover layer is typically fastened to the carrier tape with a pressure or temperature activated adhesive along each of its two longitudinal edges. The carrier tape also includes a plurality of through-holes 42 spaced at a predefined pitch, wherein a drive mechanism is able to engage the holes and advance the tape at a controlled rate/distance in order to accurately present the components to the pick-up location.

In component tape feeders, such as the Hover-Davis models noted above, a tape feeder advances the carrier tape to position a depression, and the component within the depression, at a predetermined pick-up point, where the host pick and place assembly machine is able to retrieve the component for placement on the printed circuit board. As the carrier tape is advanced off of a supply reel, the cover layer is typically pulled or peeled back from the carrier tape, just before the pick-up point, and wound upon a cover layer take-up reel, thereby exposing the depression 34 and the component 36 just before it reaches the pick-up point.

A long-standing problem with this technology has been the disposition of the cover tape. Two main methods are in use for dealing with the problem. The first is to wind the cover tape on a take-up reel located above and behind the pick point.

Examples of patents in which this solution is employed include U.S. Pat. Nos. 4,327,482; 4,735,341; and 5,299,902, the teachings of which are hereby incorporated by reference. A problem with this method is that in order for the take-up reel to be reused, the cover tape has to be manually unwound therefrom. In addition, the cover tape must initially be threaded, or otherwise attached, to the take-up reel for the winding of the cover tape around the reel to occur. This is often accomplished with adhesive tape (e.g., masking or splicing tape) and also requires that tape be readily available when starting a new take-up reel for the carrier tape. However, attachment requires that a sufficient quantity of the cover tape be available to reach the take-up reel and attach thereto often resulting in wasted components. Furthermore, "threading" the take-up reel interrupts the assembly process, resulting in significant loss in productivity for cover tape threading, disposal, etc.

A second method of handling the cover tape after it is peeled back from the carrier tape involves using a pair of pinch rollers to push the cover tape into a disposal bin. U.S. Pat. No. 5,725,140 to Weber et al., also incorporated herein by reference, discloses this method. While such a system resolves the take-up reel problem, it still requires separate disposal of the cover tape, and the cover tape must still be started with a measure of the cover tape being routed through the feeder to the pinch rollers and through the pinch rollers each and every time a new reel of component tape is started or restarted in the feeder.

Another method is disclosed in U.S. Pat. No. 4,820,369 to Masahiro et al. wherein the tape is slit using a tongue or shoe that slides under cover tape to cut and peel the tape back along an edge or center cut. A similar disclosure by Siemens in DE 3214600A1 teaches a peeling back operation. However, it will be appreciated that various peeling and cutting operations, in close proximity to a pick-up location must be highly reliable. Moreover, when a cutting edge is employed the edge will, over time, become dulled by the cutting become an obstacle to forward motion of the carrier tape—possibly resulting in a jam and loss of productivity, and/or replacement that will require that the feeder be removed from service.

The present invention solves the various problems described above by not only avoiding the complete separation of the carrier tape and the cover tape and allowing disposal of the cover tape and carrier base, but also avoiding the need for a sharp cutting edge through the use of a radiant energy beam or resistive thermal energy source to cut the cover tape prior to opening the tape for access to the components therebelow. More specifically, the cover tape is cut using a localized heating means such as a laser or resistive thermal energy source to vaporize a small line in parallel with the longitudinal edge of the tape. The line may be at or near an edge, or down the middle of the cover-tape layer (e.g., for wider component tapes). The cover tape flap(s) created by the laser cutting operation may then be either folded back away from the region above the component, whereby the component is exposed for retrieval at the pick-up location, or the cut may be sufficient to allow a pick head to pass through the cut, engage the component and remove it from the carrier tape depression without significant interference from the cover tape layer. Subsequent to the pick-up location, the carrier tape with the parted cover tape flap(s) still attached thereto, is then directed to a waste receptacle or similar disposal mechanism, avoiding the need for a separate cover tape take-up reel and cover tape removal.

In accordance with the present invention, there is provided a component feeding apparatus for supplying components to an automated assembly system, said system using a component feeding means having a length of component carrier tape with a plurality of regularly spaced depressions in the carrier layer, each depression holding a component therein, and a cover tape thereover to retain the components within each depression until the component approaches a pick-up location, comprising: means for applying thermal energy to a localized region of the cover layer and thereby placing a cut in the cover layer as it is advanced so as to partially expose the component and create a flap of cover layer while keeping at least one edge of said cover layer affixed to the component carrier tape; and means for contacting the component through the cut and removing the component from the depression.

In accordance with another aspect of the present invention there is provided, in a component feeding apparatus for supplying components to an automated system for assembling printed circuit boards, said system using a component feeding apparatus having a length of component carrier tape with a plurality of regularly spaced depressions, each depression holding a component therein, and a cover tape layer thereover to retain the components within each depression until the component approaches a pick-up location, a method of presenting components for retrieval at the pick-up location, comprising the steps of: in advance of the pick-up location, cutting the cover layer with a thermal energy source so as to create a cover layer flap and thereby partially expose the component while keeping at least one edge of said cover layer affixed to the component carrier tape; and while feeding the component carrier tape, guiding the cover layer flap around the pick-up location, whereby the component is exposed and the cover layer flap will not prevent retrieval of the component at the pick-up location.

The techniques described above are advantageous because they simplify the component feeders used with surface mount assembly operations. By eliminating the need to separately handle the carrier and cover tape members, and the need to sharpen or replace cutting edges, the component feeding process is simplified and made more reliable. Moreover, once the cover tape problem is appropriately addressed, it may be easier to utilize a splicing operation wherein the end of one reel of component tape can be spliced to the beginning of another reel, and the operation of the assembly system can proceed uninterrupted for longer periods of time.

The aspects of the present invention are advantageous because they provide a reliable cutting technique that is useful for cutting a cover tape, and techniques for spacing or positioning the radiant energy beam or resistive thermal energy source for optimized cutting. A wide variety of component feeding operations can be implemented using these techniques. Each technique can ensure that the component tape (carrier and cover) is fed to the pick-up location with a slit cover tape, thereby simplifying access to the components and disposal of the component tape. As a result of the invention, the performance and maintenance of a component tape feeding system is significantly improved.

Figure 1:
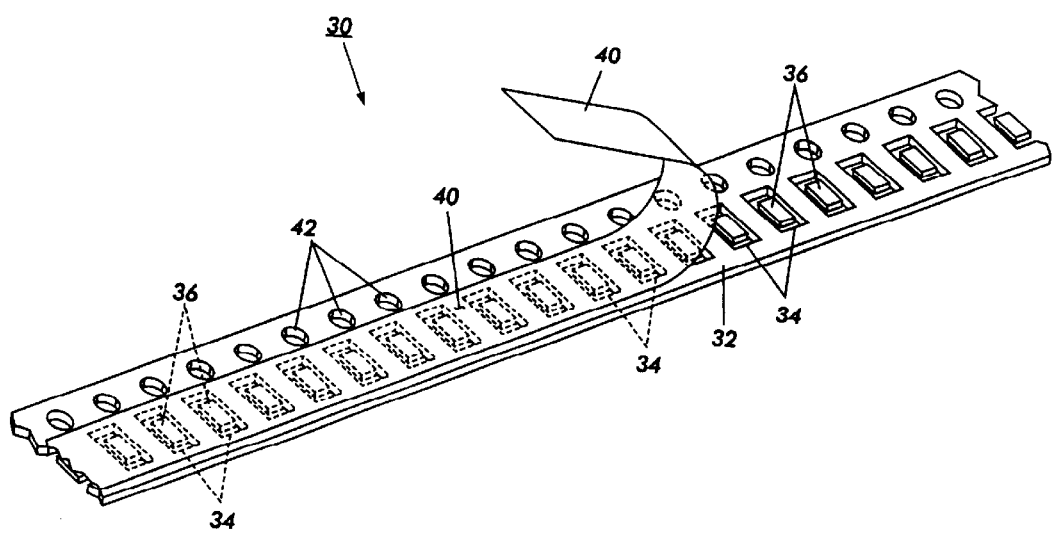
FIG. 1 is a prior art representation of well-known component carrier tape.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by the appended claims.

DESCRIPTION OF THE PREFERRED EMBODIMENT

For a general understanding of the present invention, reference is made to the drawings. In the drawings, like reference numerals have been used throughout to designate identical elements. In describing the present invention, the following term(s) have been used in the description.

"Component" is used to represent any of a number of various elements that may be automatically retrieved and applied to a printed circuit board (PCB). "Component carrier tape" and "carrier tape" is intended to represent a component feeding tape having at least a carrier or base layer with depressions in which the components are carried, and a "cover tape" thereover to retain the components within the depressions. Component carrier tapes come in various widths, depending upon component size and are typically in the range of 5 mm to 56 mm and larger. The parallel, longitudinal edges of the cover layer are affixed to the carrier layer using an adhesive or thermal process so the cover layer generally remains attached to the carrier layer when the component carrier tape is wound on a reel for ease of transportation and use.

Figure 2:
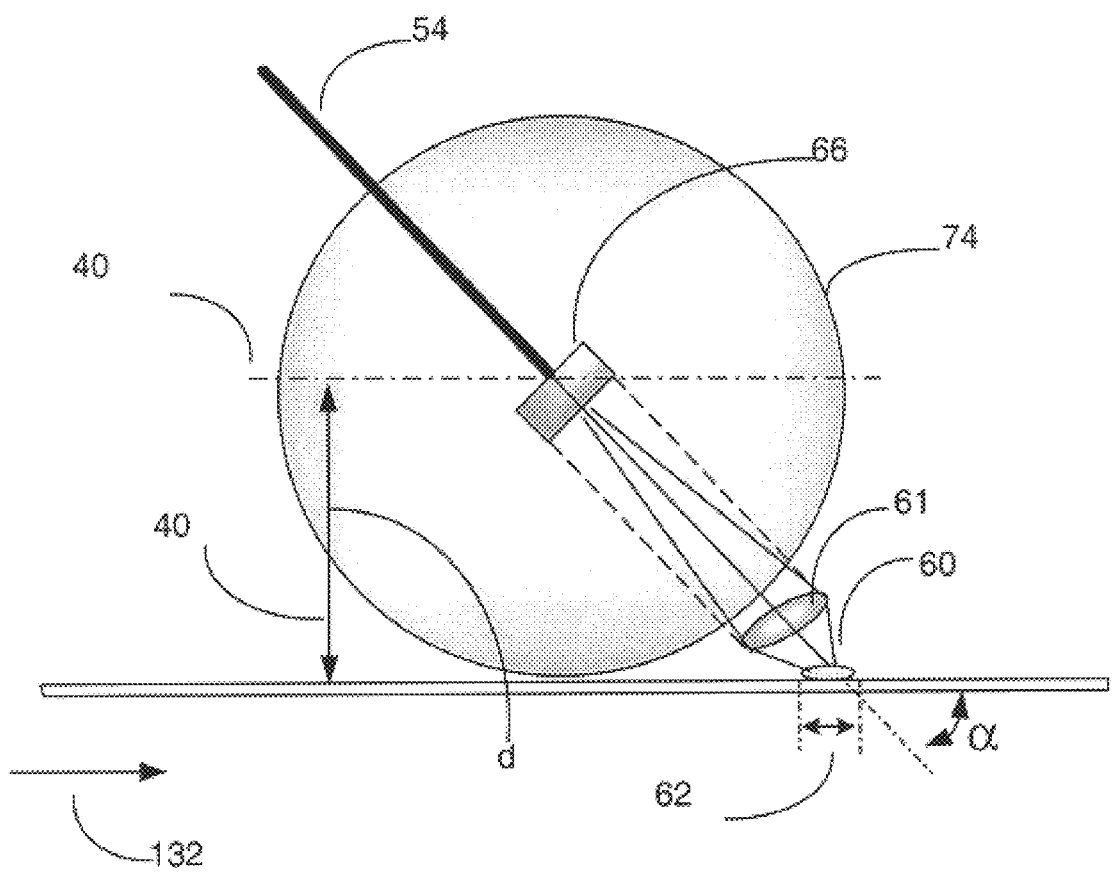
FIGS. 2–4 are various schematic illustrations depicting an embodiment of a cover tape cutting apparatus in accordance with the present invention.
Figure 3:
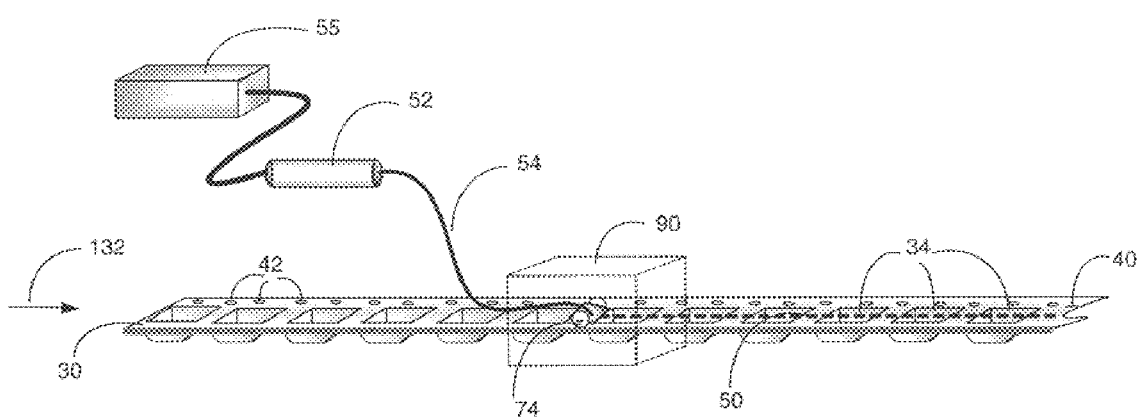
Figure 4:
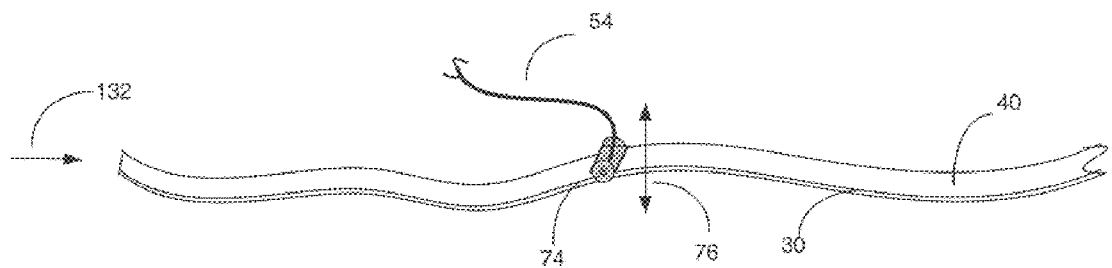

Referring now to FIGS. 2 through 4, an embodiment of the present invention will be generally described. Component carrier tape 30 is preferably fed in the direction of arrow 132 in a conventional manner using a sprocket having drive teeth (not shown) to engage holes 42 from beneath. At the time the carrier tape is advanced, the cover tape 40, on the upper surface thereof, must be cut in order to provide access to the components within depressions 34. In accordance with the present invention, the cover tape is cut longitudinally along a mid-line 50 by a vaporization of a continuous region of the cover tape as the tape is advanced. The vaporization or combustion of the cover tape 40 is caused by a high-intensity radiant energy beam 60 that is focused, at an angle $\alpha$, along an ellipse-shaped region of the cover tape. While it will be appreciated that various angles from approximately 10–170 degrees maybe employed, including a beam normal to the surface of the cover tape, it is believed that an angled beam of approximately 45 degrees as depicted in FIG. 2 is preferred as it provides for a reasonably sized heating region 62 in order to assure sufficient exposure and "cutting" of the cover tape.

Although not depicted in the embodiments of FIGS. 2–5, it will also be appreciated that the cover tape may be cut in alternative or additional directions so as to provide an opening or flap above a component. For example, the beam may be moved or oscillated so as to create a circular hole, an "X-shaped" cut, etc., where a pick head at a pick location may be able to penetrate the cut cover tape and retrieve the component.

As specifically depicted in FIG. 3, the radiant energy beam source 52 is preferably a semiconductor laser, although other well-known laser devices and their equivalents may be used. The laser has electrical energy supplied thereto from an external source (55) associated with the component tape feeder. The laser emits a radiant energy beam, preferably in an infra-red or visible infra-red wavelength which is captured using a flexible "light pipe" 54 or similar optical path as is well-known in the optics industry. The light pipe is preferably of a limited length, being no more than approximately 12 inches long so as to control or limit the attenuation of the radiant energy being transmitted therethrough.

At the end of the light pipe is an optical assembly such as a lens or equivalent mechanism 61 for focusing the radiant energy beam in a focal plane at the surface Is of the cover tape. It will be appreciated that in place of the light pipe and/or lens, equivalent optical elements may be employed for directing and concentrating the radiant beam energy at the surface of the cover tape layer. The depth of focus of the lens 61 or equivalent element, and therefore the beam 60, is limited, and the cover tape must be maintained at a controlled distance from the lens 61. While such control may be obtained by a fixed lens mount and controlling the cover tape in relation thereto, in a manner not illustrated, the embodiment depicted is an alternative to such a fixed mount.

Referring specifically to FIGS. 2–4, there is depicted an idler roll, axle or skid system, where the distance d from the lens 61 to the cover tape upper surface is controlled by the roller(s) 74. More specifically, one or more rollers 74 may be placed in contact with the upper surface of the cover tape, where the rollers are allowed to move up or down as indicated by arrows 76 in FIG. 4. It will be appreciated that the rollers would be constrained by an assembly (not shown) so that they were free to rotate and to move in a vertical direction so as to maintain contact with the cover tape. It is further contemplated that a spring or similar loading mechanism may be used to apply a downward normal force to the rollers 74 so that they are encouraged to maintain contact with the upper surface of the cover tape. Although not depicted in detail, the assembly that constrains the rollers may also be employed to control the angle of incidence of the radiant energy beam at the same time, thereby assuring a generally consistent angle and distance.

As depicted in FIG. 3, the radiant beam cutting apparatus may also be contained within a housing 90, to provide shielding and even a negative pressure atmosphere to remove any gaseous (smoke) or small particulate byproducts of the cover tape vaporization. For example, housing 90 may have a continuous contact with the surface of the cover tape, or may have pass-through holes on either end thereof, and a negative pressure may be created by a well-known muffin fan or blower mechanism.

Figure 5:
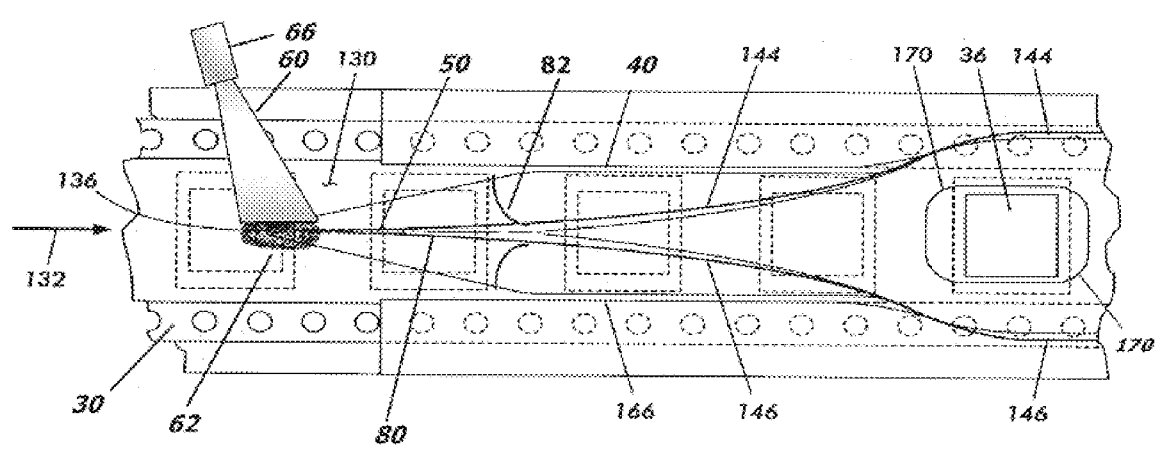
FIG. 5 is a representation of a tape parting apparatus employed in conjunction with the cutting apparatus of FIGS. 2–4.

Referring next to FIG. 5, depicted therein is a post-cutting apparatus that may be employed to expose components 36 within carrier tape 30. As the carrier tape is moved in a direction 132, and the cover tape 40 has been cut along line 50, a blunt nose 80 and underlying shoulders 82 one or either side thereof may be used to push the cut flap(s) of the cover tape outward so as to expose component 36 therebelow. It should be noted that because the nose does not serve as a cutting mechanism, it does not need to be sharpened and therefore does not present a to danger to an operator of the feeder during loading or service.

More specifically, the flaps 144 and 146 of cover tape 40, having been cut in approximately the middle of the cover tape (although alternative cut locations may be employed), may be peeled or flapped in a generally outward direction by the increased width of the nose 80. As described by Miller et al. in co-pending application Ser. No. 09/558,114 for a "COMPONENT TAPE FEEDER WITH COVER TAPE PEELBACK" filed Apr. 25, 2000, and hereby incorporated by reference, a pair of parallel vertical channels may be used to direct the parted flaps around the pick location 170 as tape 30 advances.

Figure 6:
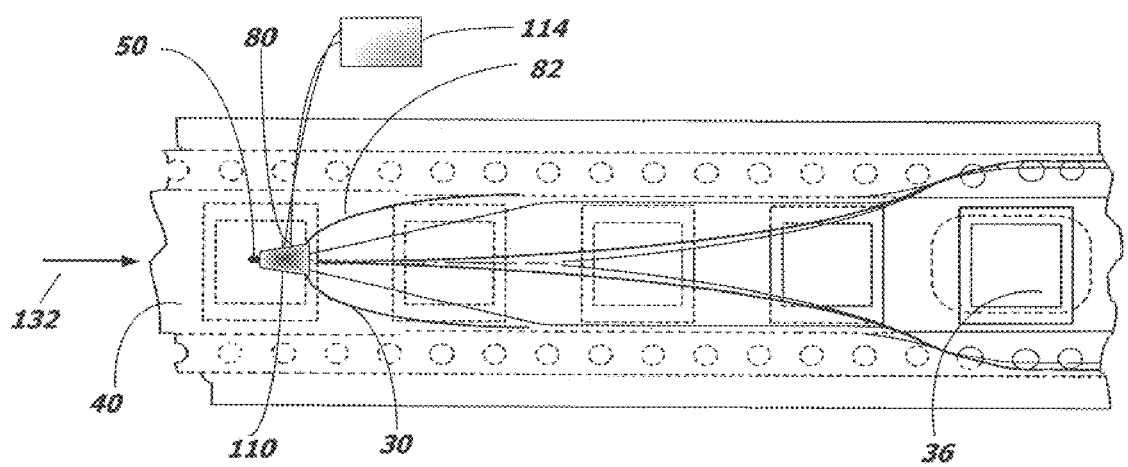
FIG. 6 is a perspective representation of an alternative embodiment of the present invention.

Referring lastly to FIG. 6, depicted therein is a modification of the postcutting apparatus of FIG. 5 to incorporate the thermal energy source therein. As the carrier tape is moved in a direction 132, the cover tape 40 is cut along line 50. More specifically, a blunt nose 80 and underlying shoulders 82 on one or either side thereof may be used to lift the cover tape layer and present the tape to a thermal energy source such as the radiant energy beam (e.g. laser) as described above, or a resistive thermal energy source such as a single or multiple-element heater or resistive wire 110 as depicted in FIG. 6. The thermal energy source, as will be appreciated, is preferably powered by a suitable power supply 114 that may be modulated and controlled for temperature and as a function of the speed or advancement of the cover tape layer.

After cutting by the thermal energy source, cut flap(s) of the cover tape are further displaced or folded outward so as to expose component 36 therebelow. It should be noted that because the nose does not serve as a cutting mechanism, it does not need to be sharpened and therefore does not present a danger to an operator of the feeder during loading or service. As previously described with respect to FIG. 5, the cut flap(s) are then displaced in a generally outward direction by the increased width of the nose 80 and a pair of parallel vertical channels (not shown) may be used to direct the parted flaps around the pick location as the tape advances.

The various embodiments of the present invention described herein are considered improvements over existing component tape feeding systems. Accordingly, the present invention contemplates and is intended to incorporate therein an entire feeding apparatus employing the methods and embodiments described above. A complete feeder is neither discussed nor shown in the drawings, as this is believed unnecessary in view of the prior art feeder technology that is well-known (e.g., in the patents and products referenced above, all of which have been previously incorporated by reference).

In recapitulation, the present invention is a method and apparatus for cutting the cover tape on a component carrier tape in order to allow component retrieval by an automated assembly system. More specifically, the cover tape is cut using a thermal energy source that vaporizes the cover tape layer so as to partially expose the component below. The cover tape flap(s) created by the cutting operation may then be folded back so as to expose the component for retrieval at the pick-up location. Subsequent to the pick-up location, the carrier tape with the parted cover tape flap(s) attached thereto, are directed to a waste receptacle or similar disposal mechanism.

It is, therefore, apparent that there has been provided, in accordance with the present invention, a method and apparatus for cutting the cover tape with a thermal energy source so as to enable the retrieval of the component. While this invention has been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of the appended claims.

What is claimed is:

1. A component feeding apparatus for supplying components to an automated assembly system, said system using a component feeding means having a length of component carrier tape with a plurality of regularly spaced depressions in the carrier layer, each depression holding a component therein, and a cover tape thereover to retain the components within each depression until the component approaches a pick-up location, comprising:

radiant energy means for applying thermal energy to a localized region of the cover layer and thereby placing a continuous cut in the cover layer as it is advanced so as to partially expose the component and create a flap of cover layer tape while keeping at least one edge of said continuously cut cover layer affixed to the component carrier tape; and means for contacting the component through the cut and removing the component from the depression.

2. The apparatus of claim 1, wherein said thermal energy means is a laser.

3. The apparatus of claim 2, wherein said laser further comprises:

a high-intensity radiant energy source; and a fiber-optic member for transporting the radiant energy from said high-intensity radiant energy source to a focusing means adjacent the upper surface of the cover layer.

4. The apparatus of claim 3, further comprising a tape following means so as to control the distance between the focusing means and the cover layer.

5. The apparatus of claim 1, wherein said thermal energy means comprises:

a resistive heater; and a power source connected to said resistive heater.

6. The apparatus of claim 5, wherein said resistive heater is a wire.

7. The apparatus of claim 5, further comprising a nose for lifting the cover layer and presenting the tape to said resistive heater.

8. The apparatus of claim 1, wherein said means for contacting the component through the cut includes a parting means for displacing the flap of the cut cover layer to expose the component.

9. The apparatus of claim 8, wherein said parting means is a device for folding back the flap of the cut cover layer.

10. In a component feeding apparatus for supplying components to an automated system for assembling printed circuit boards, said system using a component feeding apparatus having a length of component carrier tape with a plurality of regularly spaced depressions, each depression holding a component therein, and a cover tape layer thereover to retain the components within each depression until the component approaches a pick-up location, the method of presenting components for retrieval at the pick-up location, comprising the steps of:

in advance of the pick-up location, continuously cutting the cover layer with a radiant energy thermal source so as to create a cover layer flap and thereby partially expose the component while keeping at least one edge of said cover layer affixed to the component carrier tape; and while feeding the component carrier tape, guiding the cover layer flap around the pick-up location, whereby the component is exposed and the cover layer flap will not prevent retrieval of the component at the pick-up location.

11. The method of claim 10, wherein said cutting step employs a laser as the thermal energy source.

12. The method of claim 10, wherein said cutting step further comprises:

energizing a high-intensity radiant energy source; and transporting, via a fiber-optic member, radiant energy from said high-intensity radiant energy source to a focusing means adjacent an upper surface of the cover layer.

13. The method of claim 12, further comprising the step of controlling the distance between the focusing means and the cover layer using a tape following means.

14. The method of claim 10, wherein said cutting step comprises energizing a resistive heater with a power source connected thereto, to provide the thermal energy source.

15. The method of claim 14, further comprising lifting the cover layer with a nose, and presenting the tape to said resistive heater.

* * * * *